(12) United States Patent
Lin et al.

(10) Patent No.: US 8,304,268 B2
(45) Date of Patent: Nov. 6, 2012

(54) FABRICATION METHOD OF SEMICONDUCTOR PACKAGE STRUCTURE

(75) Inventors: Pang-Chun Lin, Taichung (TW);
Chun-Yuan Li, Taichung (TW);
Chien-Ping Huang, Taichung (TW);
Chun-Chi Ke, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 401 days.

(21) Appl. No.: 12/770,059

(22) Filed: Apr. 29, 2010

(65) Prior Publication Data

US 2011/0159643 A1  Jun. 30, 2011

(30) Foreign Application Priority Data

Dec. 31, 2009  (TW) .............................. 98146227 A

(51) Int. Cl.
*H01L 21/44* (2006.01)

(52) U.S. Cl. .......... 438/33; 438/113; 438/124; 438/458; 438/459; 438/462; 438/666; 29/825; 29/855; 29/856; 257/E23.124

(58) Field of Classification Search .................. None
See application file for complete search history.

(56) References Cited

U.S. PATENT DOCUMENTS

| | | | |
|---|---|---|---|
| 5,942,794 A | 8/1999 | Okumura et al. | |
| 6,143,981 A | 11/2000 | Glenn | |
| 6,238,952 B1 | 5/2001 | Lin | |
| 6,291,274 B1 | 9/2001 | Oida et al. | |
| 6,399,415 B1 | 6/2002 | Bayan et al. | |
| 6,414,385 B1 | 7/2002 | Huang et al. | |
| 6,420,779 B1 | 7/2002 | Sharma et al. | |
| 6,424,024 B1 | 7/2002 | Shih et al. | |
| 6,498,099 B1 | 12/2002 | McLellan et al. | |
| 6,700,188 B2 | 3/2004 | Lin | |
| 6,706,547 B2 * | 3/2004 | Sakamoto et al. | 438/33 |
| 6,777,265 B2 | 8/2004 | Islam et al. | |
| 6,872,661 B1 * | 3/2005 | Kwan et al. | 438/689 |
| 6,967,125 B2 * | 11/2005 | Fee et al. | 438/112 |
| 7,049,177 B1 | 5/2006 | Fan et al. | |
| 7,081,403 B1 * | 7/2006 | Kirloskar et al. | 438/612 |
| 8,003,444 B2 * | 8/2011 | Takai et al. | 438/123 |
| 2001/0045625 A1 * | 11/2001 | Sakamoto et al. | 257/666 |
| 2002/0197826 A1 * | 12/2002 | Kim et al. | 438/460 |
| 2003/0096456 A1 * | 5/2003 | Yasunaga et al. | 438/124 |

* cited by examiner

*Primary Examiner* — David E Graybill
(74) *Attorney, Agent, or Firm* — Peter F. Corless; Steven M. Jensen; Edwards Wildman Palmer LLP

(57) ABSTRACT

A fabrication method of a semiconductor package structure includes: patterning a metal plate having first and second surfaces; forming a dielectric layer on the metal plate; forming a metal layer on the first surface and the dielectric layer; forming metal pads on the second surface, the metal layer having a die pad and traces each having a bond pad; mounting a semiconductor chip on the die pad, followed by connecting electrically the semiconductor chip to the bond pads through bonding wires; forming an encapsulant to cover the semiconductor chip and the metal layer; removing portions of the metal plate not covered by the metal pads so as to form metal pillars; and performing a singulation process. The fabrication method is characterized by disposing traces with bond pads close to the die pad to shorten the bonding wires and forming metal pillars protruding from the dielectric layer to avoid solder bridging.

22 Claims, 8 Drawing Sheets

FABRICATION METHOD OF SEMICONDUCTOR PACKAGE STRUCTURE

CROSS-REFERENCES TO RELATED APPLICATIONS

This application claims under 35 U.S.C. §119(a) the benefit of Taiwanese Application No. 098146227 filed Dec. 31, 2009 the entire contents of which is incorporated herein by reference.

BACKGROUND OF THE INVENTION

1. Field of the Invention

The present invention relates to fabrication methods of semiconductor package structures, and more particularly, to a fabrication method of a semiconductor package structure characterized by high quality of wire bonding but not susceptible to solder bridging.

2. Description of Related Art

In a conventional lead frame based semiconductor package such as a QFN (Quad Flat Non-lead) package, a semiconductor chip is attached and wire-bonded to a lead frame and encapsulated by an encapsulant, and metal portions around the lead frame are exposed from the encapsulant to serve as contact pads for connection with an external device. A semiconductor package structure thus fabricated is advantageously characterized by reduced size, improved electrical performance, and wide application in the industry.

FIG. 1A shows a conventional fabrication method of a semiconductor package structure as disclosed by U.S. Pat. No. 6,143,981, No. 6,424,024, No. 6,414,385, No. 5,942,794, No. 6,420,779, No. 6,399,415 and No. 6,291,274.

Referring to FIG. 1A, a semiconductor chip 11 is disposed on a lead frame 10 and electrically connected to contact pads 101 peripherally provided on the lead frame 10 through bonding wires 12, and an encapsulant 13 is formed on the lead frame 10 to encapsulate the semiconductor chip 11 and the bonding wires 12, thereby allowing the side surfaces and bottom surfaces of the contact pads 101 to be exposed from the encapsulant 13.

FIG. 1B is a side view of the semiconductor package structure 1 of FIG. 1A connected to a circuit board 15. Referring to FIG. 1B, the contact pads 101 are connected to solder pads 151 of the circuit board 15 through a solder material 14. However, since the contact pads are closely arranged and do not protrude from the bottom surface of the semiconductor package structure 1, when the semiconductor package structure 1 is soldered to the circuit board 15, the gap between the contact pads 101 and the solder pads 151 of the circuit board 15 is so small that it is difficult to control the gap. As a result, the reliability of the solder joints is low, the solder joints are easy to crack, and the soldering situation is difficult to check. Due to the small gap between the semiconductor package structure 1 and the circuit board 15, the solder material 14 overflows readily to thereby cause solder bridging.

Further, the semiconductor package structure 1 cannot provide array arranged contact pads and accordingly cannot provide a semiconductor package structure with high density I/O connections.

Accordingly, U.S. Pat. No. 6,498,099, No. 7,049,177, No. 6,238,952, No. 6,700,188 and No. 6,777,265 disclose a fabrication method of a semiconductor package structure, as shown in FIGS. 2A and 2B.

FIG. 2A is a cross-sectional view of a conventional fabrication method of a semiconductor package structure 2 and FIG. 2B is a top view of the semiconductor package structure 2. Referring to FIGS. 2A and 2B, half of the thickness of the lead frame 20 is etched away; a semiconductor chip 21 is disposed on the lead frame 20 and electrically connected to contact pads 201 peripherally provided on the lead frame 20 through bonding wires 22; an encapsulant 23 is formed on the lead frame 20; and then the semiconductor package structure 2 is etched for a second time such that each of the contact pads 201 protrudes from the bottom of the semiconductor package structure 2 by about half of the thickness of the lead frame 20. Further, the contact pads 201 can be arranged in array.

However, although a certain gap is provided between the contact pads and the circuit board and array-arranged contact pads are provided, since long bonding wires are required to electrically connect the semiconductor chip to the contact pads located far away, it adversely affects the electrical performance of the package structure. Further, due to tangling of the bonding wires, it is difficult for the package structure to provide high density I/O connections.

Therefore, it is imperative to overcome the above drawbacks of the prior art.

SUMMARY OF THE INVENTION

In view of the above drawbacks of the prior art, the present invention provides a fabrication method of a semiconductor package structure. The fabrication method comprises the steps of: providing a metal plate having a first surface and an opposite second surface, wherein the first surface has a die mounting area and a plurality of contact pad areas; patterning the metal plate from the first surface towards the second surface so as to form a plurality of concave portions in the metal plate outside the die mounting area and the contact pad areas; forming a dielectric layer on the patterned metal plate, the die mounting area and the contact pad areas being exposed from the dielectric layer; forming a metal layer on the first surface and the dielectric layer and forming a plurality of metal pads on the second surface, wherein the metal layer comprises a die pad corresponding in position to the die mounting area and a plurality of traces, each of the traces comprises a trace body, a bond pad extending towards the periphery of the die pad and a trace end opposite to the bond pad and connecting to a corresponding one of the contact pad areas, and the metal pads correspond in position to the die mounting area and the contact pad areas, respectively; disposing a semiconductor chip on the die pad and electrically connecting the semiconductor chip to the bond pads through a plurality of bonding wires; forming an encapsulant to cover the semiconductor chip, the bonding wires, the metal layer, and the dielectric layer; removing the portions of the metal plate not covered by the metal pads so as to form a plurality of metal pillars corresponding in position to the die mounting area and the contact pad areas, respectively, wherein the metal pillars protrude from the dielectric layer; and performing a singulation process to obtain a semiconductor package structure.

In the above-described method, the step of forming the dielectric layer can further comprise coating a dielectric layer on the patterned metal plate and grinding the dielectric layer so as to make the dielectric layer be flush with the surfaces of the die mounting area and the contact pad areas.

The step of forming the metal layer on the first surface and the dielectric layer can comprise: forming a first resist layer on the first surface and the dielectric layer and forming a plurality of first open areas in the first resist layer; forming the metal layer in the first open areas; and removing the first resist layer.

The step of forming the metal pads on the second surface can comprise: forming a second resist layer on the second surface and forming a plurality of second open areas in the second resist layer corresponding in position to the die mounting area and the contact pad areas; forming the metal pads in the second open areas; and removing the second resist layer.

In the above-described method, the metal plate can be made of copper, and the dielectric layer can be made of a polymer material comprising an epoxy resin. The metal layer and the metal pads can be formed by an electroplating process and can be made of one or more selected from the group consisting of Au, Pd, and Ni.

In addition, the contact pad areas are arranged in array to surround the die mounting area, and the bond pads are disposed at the periphery of the die pad, thereby shortening the bonding wires electrically connecting the semiconductor chip and the bond pads.

The present invention further discloses a fabrication method of a semiconductor package structure. The fabrication method comprises the steps of: providing a metal plate having a first surface and an opposite second surface, wherein the first surface has a die mounting area and a plurality of contact pad areas; patterning the metal plate from the first surface towards the second surface so as to form a plurality of concave portions in the metal plate outside the contact pad areas; forming a dielectric layer on the patterned metal plate, the contact pad areas being exposed from the dielectric layer; forming a plurality of traces on the first surface and the dielectric layer and forming a plurality of metal pads on the second surface, wherein each of the traces comprises a trace body, a bond pad extending into the die mounting area and a trace end opposite to the bond pad and connecting to a corresponding one of the contact pad areas, and the metal pads correspond in position to the contact pad areas, respectively; mounting a semiconductor chip on the bond pads for electrical connection with the traces; forming an encapsulant to cover the semiconductor chip, the traces and the dielectric layer; removing the portions of the metal plate that are not covered by the metal pads so as to form a plurality of metal pillars corresponding in position to the contact pad areas, respectively, wherein the metal pillars protrude from the dielectric layer, respectively; and performing a singulation process to obtain a semiconductor package structure.

According to the present invention, the bond pads and traces formed at the chip mounting side of the dielectric layer shorten the bonding wires and prevent tangling of the bonding wires, thereby improving the electrical connection quality of the package structure. Further, when the semiconductor package structure is soldered to a circuit board, since the metal pillars protrude from the bottom surface of the dielectric layer, it facilitates the formation of stable solder joints between the metal pillars and the circuit board and prevents solder overflow and bridging. In addition, the present invention provides high density and array arranged I/O connections so as to extend the application range of the semiconductor package structure.

BRIEF DESCRIPTION OF DRAWINGS

FIG. 3E is a cross-sectional view taken along line 3E-3E of FIG. 3E'; FIG. 4E is a cross-sectional view taken along line 4E-4E of FIG. 4E'.

DETAILED DESCRIPTION OF PREFERRED EMBODIMENTS

The following illustrative embodiments are provided to illustrate the disclosure of the present invention, these and other advantages and effects can be apparent to those in the art after reading this specification.

Figure 1A:
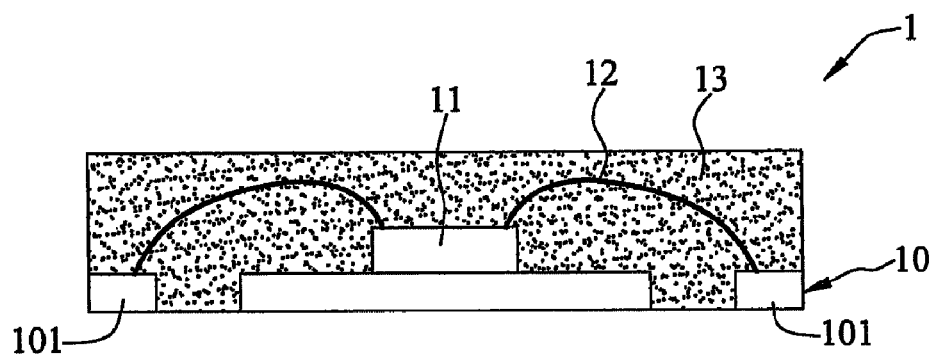
FIG. 1A is a cross-sectional view of a conventional fabrication method of a semiconductor package structure.
Figure 1B:
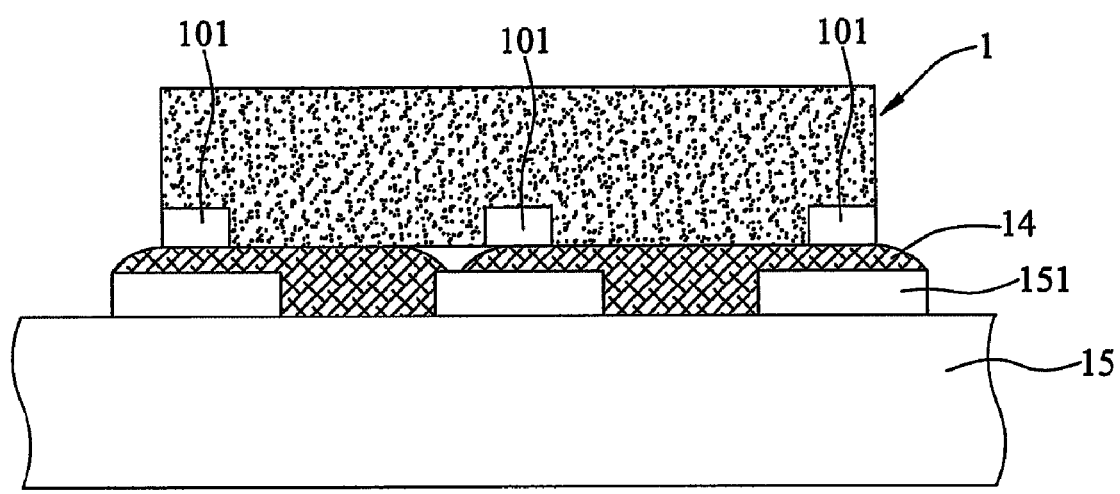
FIG. 1B is a side view of the semiconductor package structure of FIG. 1A connecting to a circuit board.
Figure 2A:
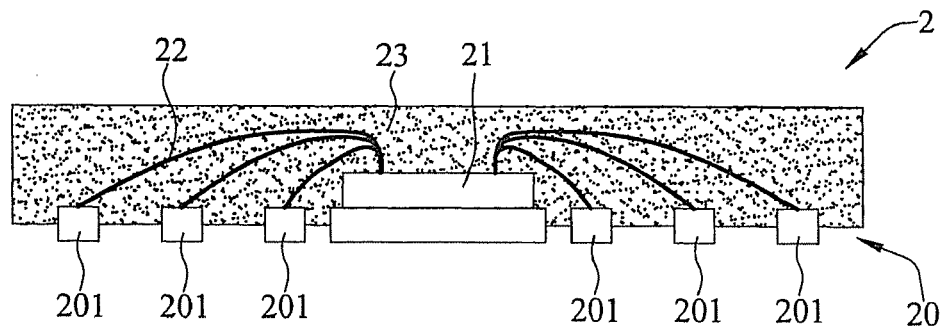
FIGS. 2A and 2B are a cross-sectional view and top view of another conventional fabrication method of a semiconductor package structure.
Figure 2B:
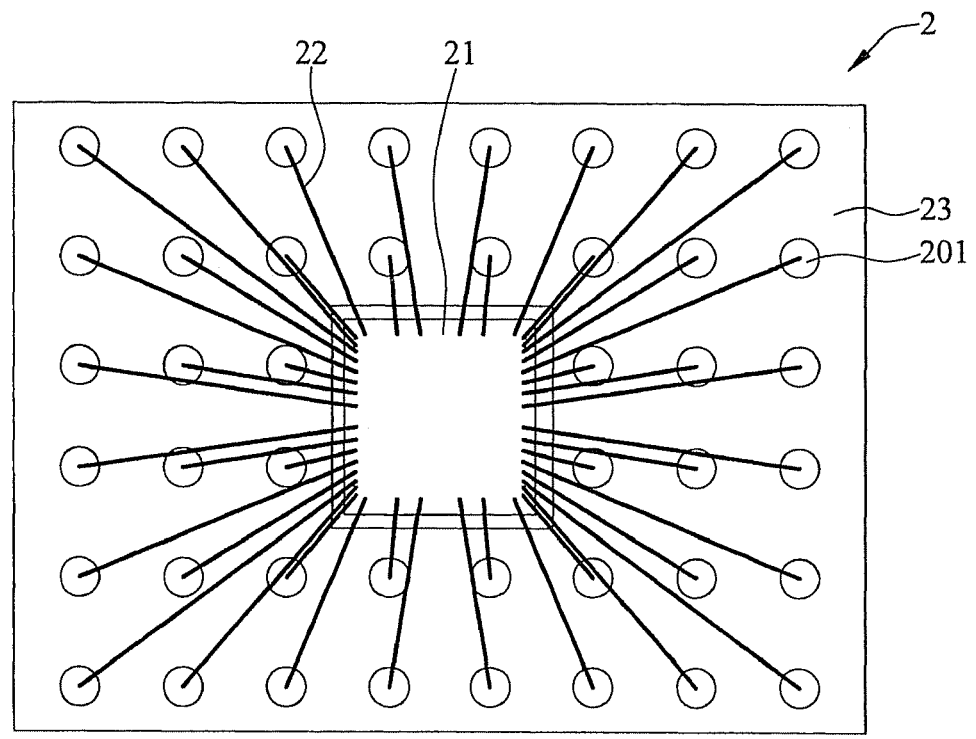
Figure 3A:
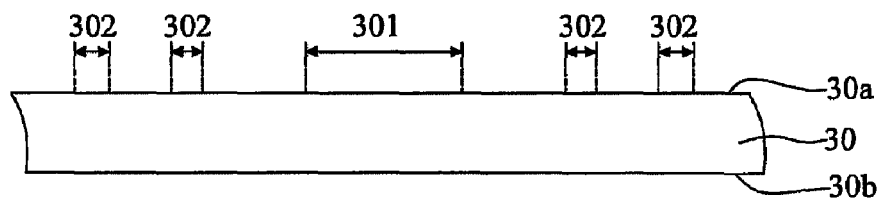
FIGS. 3A to 3G are cross-sectional views showing a fabrication method of a semiconductor package structure according to a preferred embodiment of the present invention, wherein FIG. 3E' is a top view.
Figure 3B:
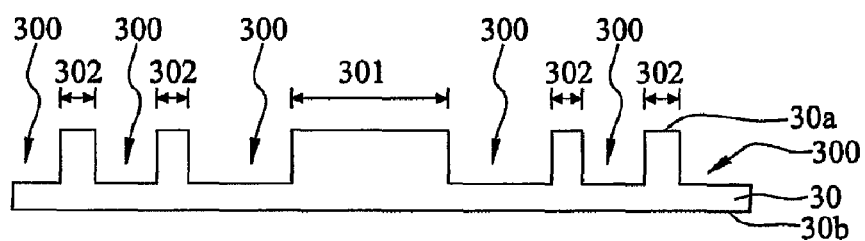
Figure 3C:
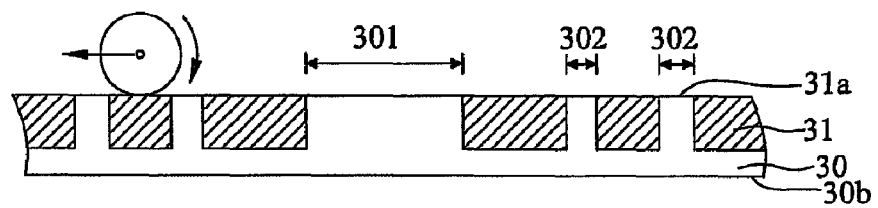
Figure 3D:
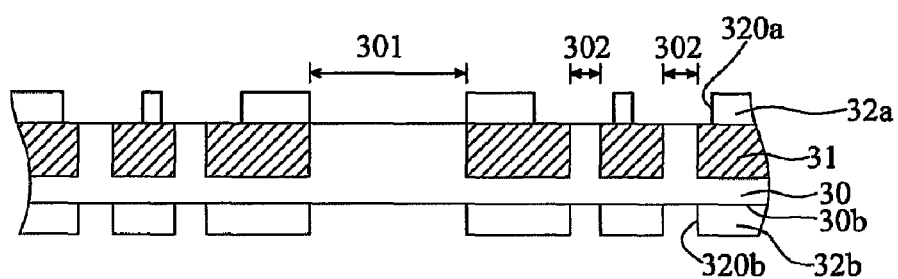
Figure 3E:
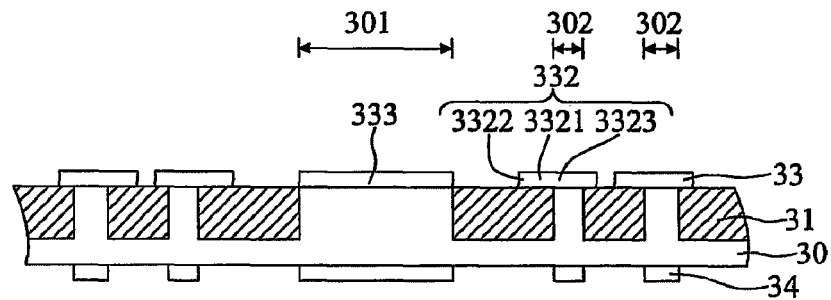
Figure 3E:
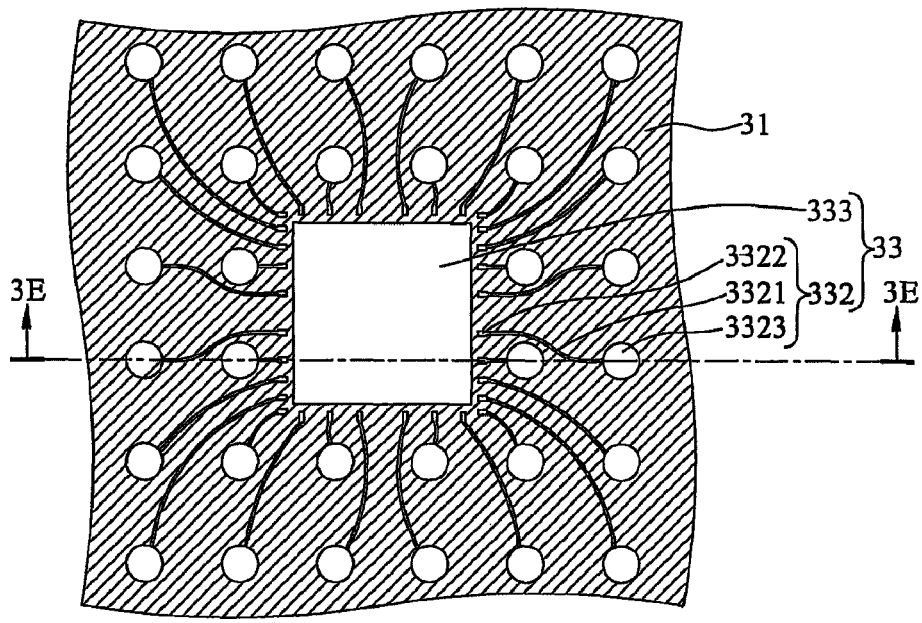

FIGS. 3A to 3G are cross-sectional views showing a fabrication method of a semiconductor package structure according to a preferred embodiment of the present invention, wherein FIG. 3E' is a top view, and FIG. 3E is a cross-sectional view taken along line 3E-3E of FIG. 3E'.

Referring to FIG. 3A, a metal plate 30 having a first surface 30a and an opposite second surface 30b is provided, wherein the first surface 30a has a die mounting area 301 and a plurality of contact pad areas 302. The metal plate 30 can be made of copper.

Referring to FIG. 3B, the metal plate 30 is patterned from the first surface 30a towards the second surface 30b so as to form a plurality of concave portions 300 in the metal plate 30 outside the die mounting area 301 and the contact pad areas 302, wherein the concave portions 300 surrounding the die mounting area 301 and the contact pad areas 302. The patterning of the metal plate 30 or the formation of the concave portions 300 can be implemented by means of a resist layer (not shown) and performed by an etching process. Since such a technique is well known in the art, detailed description thereof is omitted herein.

Referring to FIG. 3C, a dielectric layer 31 is formed on the patterned metal plate 30, with the die mounting area 301 and the contact pad areas 302 exposed from the dielectric layer 31. Specifically speaking, a dielectric layer 31 is coated in the concave portions 300 and on the first surface 30a, and then a portion of the dielectric layer 31 which is higher than the first surface 30a is removed to expose the die mounting area 301 and the contact pad areas 302. The dielectric layer 31 can be made of a polymer material comprising an epoxy resin. In addition, the higher portion of the dielectric layer 31 can be removed by a grinding process such that the dielectric layer 31 thus ground is flush with the surfaces of the die mounting area 301 and the contact pad areas 302.

Referring to FIG. 3D, a first resist layer 32a is formed on the first surface 30a and the dielectric layer 31, and a plurality of first open areas 320a is formed in the first resist layer 32a; meanwhile, a second resist layer 32b is formed on the second surface 30b, and a plurality of second open areas 320b is formed in the second resist layer 32b such that the second open areas 320b thus formed correspond in position to the die mounting area 301 and the contact pad areas 302, respectively.

Referring to FIGS. 3E and 3E', a metal layer 33 is formed in the first open areas 320a, and a plurality of metal pads 34 is formed in the second open areas 320b, respectively. The metal layer 33 comprises a die pad 333 corresponding in position to the die mounting area 301 and a plurality of traces 332. Each of the traces 332 comprises a trace body 3321, a bond pad 3322 extending to the periphery of the die pad 333, and a trace end 3323 opposite to the bond pad 3322 and connected to a corresponding one of the contact pad areas 302. The metal pads 34 correspond in position to the die mounting area 301 and the contact pad areas 302, respectively. Thereafter, the first resist layer 32a and the second resist layer 32b are removed. The metal layer 33 and the metal pads 34 can be formed by an electroplating process and can be made of one or more selected from the group consisting of Au, Pd, and Ni, for example, Au/Pd/Ni/Pd.

The fabrication method of the present invention is not limited by the sequence in which the metal layer and the metal pads are formed, because it is feasible to form the metal layer and the metal pads concurrently by an electroplating process despite the variable sequence in which the first resist layer and the second resist layer are formed.

Referring to FIG. 3E', the contact pad areas 302 are arranged in array to surround the die mounting area 301, and the bond pads 3322 are disposed at the periphery of the die pad 333 to surround the die pad 333.

Referring to FIG. 3E', the metal pillars 303 are arranged in array to surround the die pad 333, and preferably, the bond pads 3322 are disposed at the periphery of the die pad 333 to surround the die pad 333.

Figure 3F:
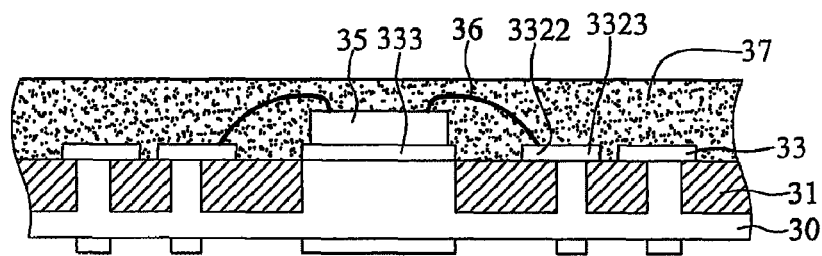

Referring to FIG. 3F, a semiconductor chip 35 is mounted on the die pad 333 and electrically connected to the bond pads 3322 through a plurality of bonding wires 36, and an encapsulant 37 is formed to cover the semiconductor chip 35, the bonding wires 36, the metal layer 33 and the dielectric layer 31.

Figure 3G:
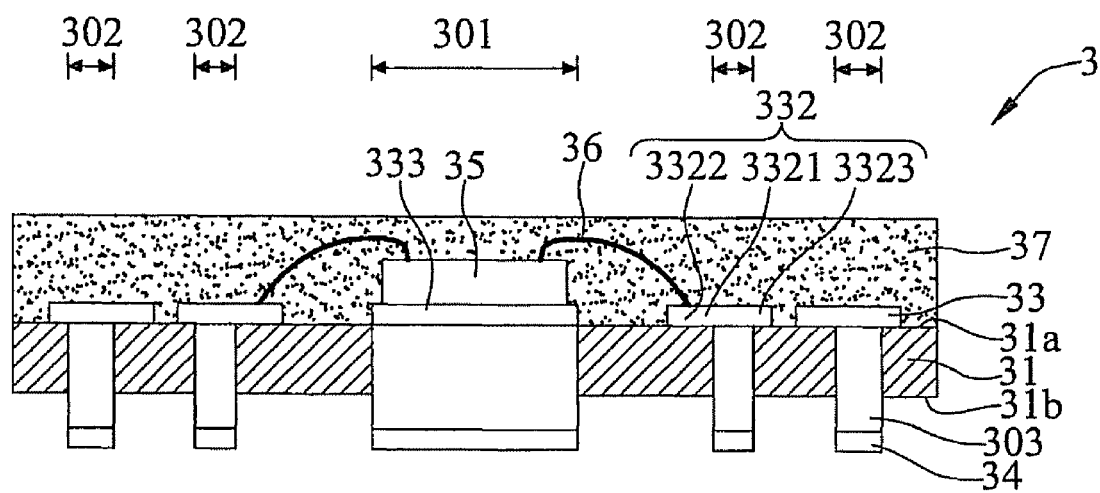

Referring to FIG. 3G, the portions of the metal plate 30 that are not covered by the metal pads 34 are removed so as to form a plurality of metal pillars 303 corresponding in position to the die mounting area 301 and the contact pad areas 302 and protruding from the dielectric layer 31. Finally, a singulation process is performed to obtain a semiconductor package structure 3.

Figure 4A:
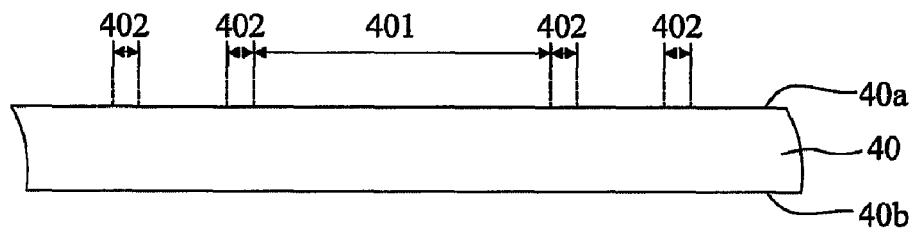
FIGS. 4A to 4G are cross-sectional views showing a fabrication method of a semiconductor package structure according to another embodiment of the present invention, wherein FIG. 4E' is a top view.
Figure 4B:
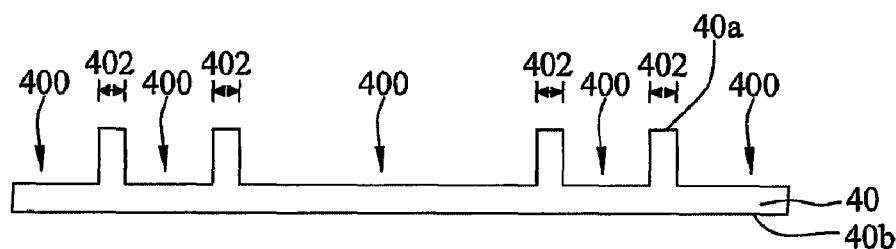
Figure 4C:
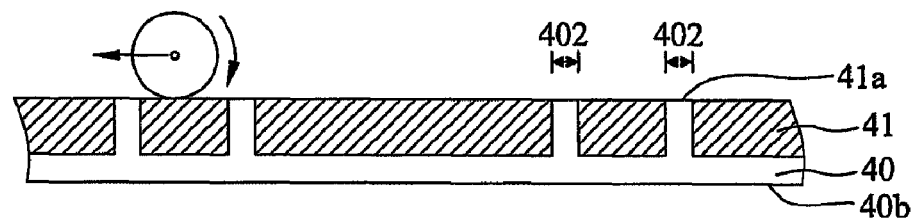
Figure 4D:
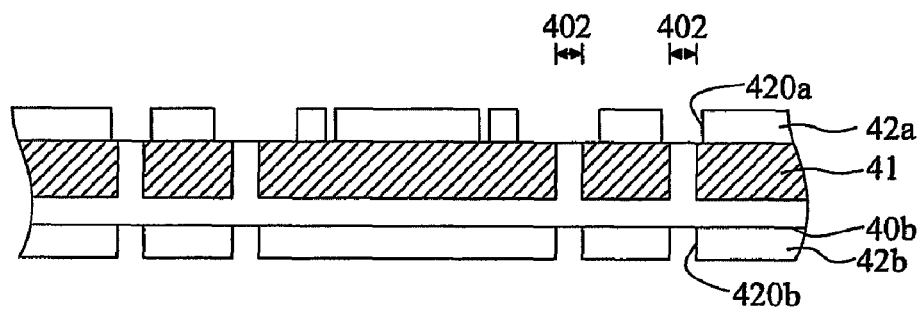
Figure 4E:
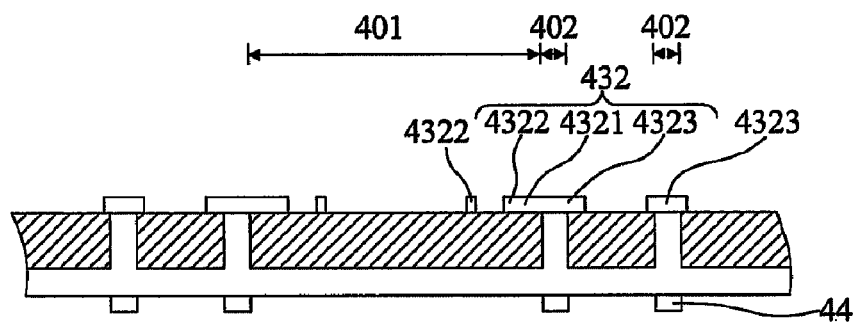
Figure 4E:
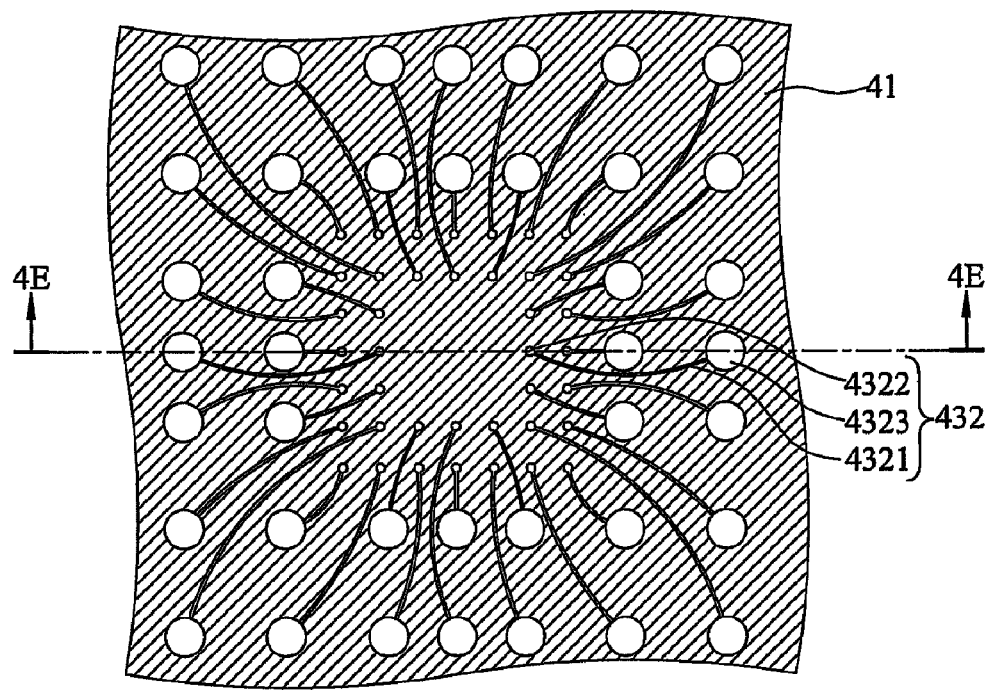

FIGS. 4A to 4G are cross-sectional views showing a fabrication method of a semiconductor package structure according to another embodiment of the present invention, wherein FIG. 4E' is a top view, and FIG. 4E is a cross-sectional view taken along line 4E-4E of FIG. 4E'.

Referring to FIG. 4A, a metal plate 40 having a first surface 40a and an opposite second surface 40b is provided, wherein the first surface 40a has a die mounting area 401 and a plurality of contact pad areas 402. The metal plate 40 can be made of copper.

Referring to FIG. 4B, the metal plate 40 is patterned from the first surface 40a towards the second surface 40b so as to form a plurality of concave portions 400 in the metal plate 40 outside the contact pad areas 402, respectively. The patterning of the metal plate 40 or the formation of the concave portions 4300 can be implemented by means of a resist layer (not shown) and performed by an etching process. Since such a technique is well known in the art, detailed description thereof is omitted herein.

Referring to FIG. 4C, a dielectric layer 41 is formed on the patterned metal plate 40, with the contact pad areas 402 exposed from the dielectric layer 41. Specifically speaking, a dielectric layer 41 is coated in the concave portions 400 and on the first surface 40a, and then a portion of the dielectric layer 41 which is higher than the first surface 40a is removed to expose the contact pad areas 402. The dielectric layer 41 can be made of a polymer material comprising an epoxy resin. In addition, the dielectric layer 41 can be removed by a grinding process such that the dielectric layer 41 thus ground is flush with the surfaces of the contact pad areas 402.

Referring to FIG. 4D, a first resist layer 42a is formed on the first surface 40a and the dielectric layer 41, and a plurality of first open areas 420a is formed in the first resist layer 42a; meanwhile, a second resist layer 42b is formed on the second surface 40b, and a plurality of second open areas 420b is formed in the second resist layer 42b such that the second open areas 420b thus formed correspond in position to the contact pad areas 402, respectively.

Referring to FIGS. 4E and 4E', a plurality of traces 432 is formed in the first open areas 420a, and a plurality of metal pads 44 is formed in the second open areas 420b. Each of the traces 432 comprises a trace body 4321, a bond pad 4322 extending into the die mounting area 401, and a trace end 4323 opposite to the bond pad 4322 and connected to a corresponding one of the contact pad areas 402. The metal pads 44 correspond in position to the contact pad areas 402, respectively. Thereafter, the first resist layer 42a and the second resist layer 42b are removed. The traces 432 and the metal pads 44 can be formed by an electroplating process and can be made of one or more selected from the group consisting of Au, Pd, and Ni, for example, Au/Pd/Ni/Pd.

The fabrication method of the present invention is not limited by the sequence in which the plurality of traces and the plurality of metal pads are formed, because it is feasible to form the plurality of traces and the plurality of metal pads concurrently by an electroplating process despite the variable sequence in which the first resist layer and the second resist layer are formed.

Referring to FIG. 4E', the contact pad areas 402 can be arranged in array to surround the die mounting area 401, and the bond pads 4322 can be arranged in array in the die mounting area 401.

Referring to FIG. 4E', the metal pillars 403 can be arranged in array to surround the die mounting area 401, and preferably, the bond pads 4322 are annularly arranged within the die mounting area 401.

Figure 4F:
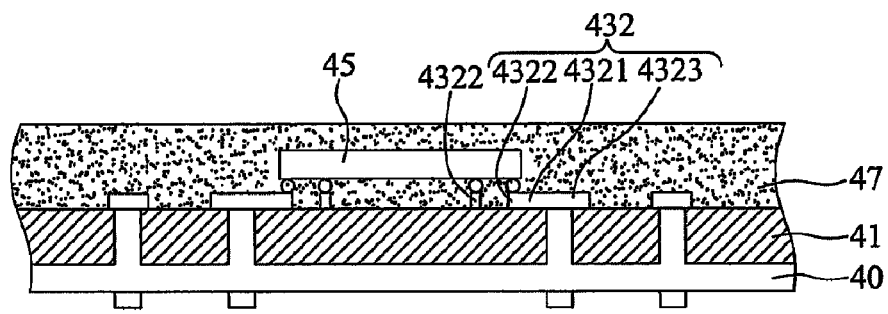

Referring to FIG. 4F, a semiconductor chip 45 is flip-chip mounted on the bond pads 4322 so as to be electrically connected to the traces 432, and an encapsulant 47 is formed to cover the semiconductor chip 45, the traces 432 and the dielectric layer 41.

Figure 4G:
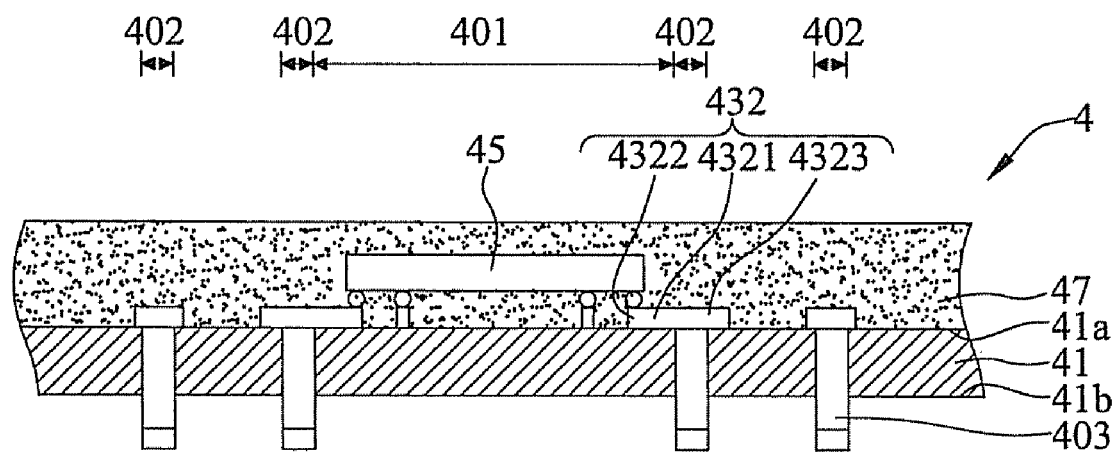

Referring to FIG. 4G the portions of the metal plate 40 that are not covered by the metal pads 44 are removed so as to form a plurality of metal pillars 403 corresponding in position to the contact pad areas 402 and protruding from the dielectric layer 41. Finally, a singulation process is performed to obtain a semiconductor package structure 4.

According to the present invention, the bond pads and traces formed at the chip mounting side of the dielectric layer shorten the bonding wires and prevent tangling of the bonding wires, thereby improving the electrical connection quality of the package structure. Further, when the semiconductor package structure is soldered to a printed circuit board, since the metal pillars protrude from the bottom surface of the dielectric layer, it facilitates the formation of stable solder joints between the metal pillars and the printed circuit board and prevents solder overflow and bridging. In addition, the present invention provides high density and array arranged I/O connections so as to extend the application range of the semiconductor package structure.

The above description of the specific embodiments is intended to illustrate the preferred implementation according to the present invention but is not intended to limit the scope of the present invention. Accordingly, all modifications and variations completed by those with ordinary skill in the art should fall within the scope of present invention defined by the appended claims.

What is claimed is:

1. A fabrication method of a semiconductor package structure, comprising the steps of:
   providing a metal plate having a first surface and an opposite second surface, wherein the first surface has a die mounting area and a plurality of contact pad areas;
   patterning the metal plate from the first surface towards the second surface so as to form a plurality of concave portions in the metal plate outside the die mounting area and the contact pad areas;
   forming a dielectric layer on the metal plate thus patterned, wherein the die mounting area and the contact pad areas are exposed from the dielectric layer;
   forming a metal layer on the first surface and the dielectric layer, followed by forming a plurality of metal pads on the second surface, the metal layer comprising a die pad corresponding in position to the die mounting area and a plurality of traces, the traces each comprising a trace body, a bond pad extending towards a periphery of the die pad, and a trace end opposite to the bond pad and connected to a corresponding one of the contact pad areas, and the metal pads corresponding in position to the die mounting area and the contact pad areas, respectively;
   mounting a semiconductor chip on the die pad, followed by connecting electrically the semiconductor chip to the bond pads through a plurality of bonding wires;
   forming an encapsulant to cover the semiconductor chip, the bonding wires, the metal layer, and the dielectric layer;
   removing the portions of the metal plate not covered by the metal pads so as to form a plurality of metal pillars corresponding in position to the die mounting area and the contact pad areas, respectively, wherein the metal pillars protrude from the dielectric layer; and
   performing a singulation process to obtain a semiconductor package structure.

2. The method of claim 1, wherein the step of forming the dielectric layer further comprises coating a dielectric layer on the patterned metal plate and grinding the dielectric layer so as for the dielectric layer thus ground to be flush with the surfaces of the die mounting area and the contact pad areas.

3. The method of claim 1, wherein the step of forming the metal layer on the first surface and the dielectric layer comprises the sub-steps of:
   forming a first resist layer on the first surface and the dielectric layer, followed by forming a plurality of first open areas in the first resist layer;
   forming the metal layer in the first open areas; and
   removing the first resist layer.

4. The method of claim 1, wherein the step of forming the metal pads on the second surface comprises the sub-steps of:
   forming a second resist layer on the second surface, followed by forming a plurality of second open areas in the second resist layer corresponding in position to the die mounting area and the contact pad areas;
   forming the metal pads in the second open areas; and
   removing the second resist layer.

5. The method of claim 1, wherein the metal plate is made of copper.

6. The method of claim 1, wherein the dielectric layer is made of a polymer material comprising an epoxy resin.

7. The method of claim 1, wherein the contact pad areas are arranged in array to surround the die mounting area.

8. The method of claim 1, wherein the metal layer and the metal pads are formed by an electroplating process.

9. The method of claim 1, wherein the metal layer is made of one or more selected from the group consisting of Au, Pd, and Ni.

10. The method of claim 1, wherein the bond pads are disposed at a periphery of the die pad.

11. The method of claim 1, wherein the metal pads are made of one or more selected from the group consisting of Au, Pd, and Ni.

12. A fabrication method of a semiconductor package structure, comprising the steps of:
   providing a metal plate having a first surface and an opposite second surface, wherein the first surface has a die mounting area and a plurality of contact pad areas;
   patterning the metal plate from the first surface towards the second surface so as to form a plurality of concave portions in the metal plate outside the contact pad areas;
   forming a dielectric layer on the metal plate thus patterned, wherein the contact pad areas are exposed from the dielectric layer;
   forming a plurality of traces on the first surface and the dielectric layer, followed by forming a plurality of metal pads on the second surface, the traces each comprising a trace body, a bond pad extending into the die mounting area, and a trace end opposite to the bond pad and connected to a corresponding one of the contact pad areas, and the metal pads corresponding in position to the contact pad areas, respectively;
   mounting a semiconductor chip on the bond pads for electrical connection with the traces;
   forming an encapsulant to cover the semiconductor chip, the traces, and the dielectric layer;
   removing the portions of the metal plate not covered by the metal pads so as to form a plurality of metal pillars corresponding in position to the contact pad areas, respectively, wherein the metal pillars protrude from the dielectric layer; and
   performing a singulation process to obtain a semiconductor package structure.

13. The method of claim 12, wherein the step of forming the dielectric layer further comprises coating a dielectric layer on the patterned metal plate and grinding the dielectric layer so as for the dielectric layer thus ground to be flush with the surfaces of the contact pad areas.

14. The method of claim 12, wherein the step of forming the traces on the first surface and the dielectric layer comprises the sub-steps of:
   forming a first resist layer on the first surface and the dielectric layer, followed by forming a plurality of first open areas in the first resist layer;
   forming the traces in the first open areas; and
   removing the first resist layer.

15. The method of claim 12, wherein the step of forming the metal pads on the second surface comprises the sub-steps of:
   forming a second resist layer on the second surface, followed by forming a plurality of second open areas in the second resist layer corresponding in position to the contact pad areas;
   forming the metal pads in the second open areas; and
   removing the second resist layer.

16. The method of claim 12, wherein the metal plate is made of copper.

17. The method of claim 12, wherein the dielectric layer is made of a polymer material comprising an epoxy resin.

18. The method of claim 12, wherein the contact pad areas are arranged in array to surround the die mounting area.

19. The method of claim 12, wherein the traces and the metal pads are formed by an electroplating process.

20. The method of claim 12, wherein the traces are made of one or more selected from the group consisting of Au, Pd, and Ni.

21. The method of claim 12, wherein the bond pads are arranged in array within the die mounting area.

22. The method of claim 12, wherein the metal pads are made of one or more selected from the group consisting of Au, Pd, and Ni.

* * * * *